US011706897B2

(12) United States Patent
Dong et al.

(10) Patent No.: US 11,706,897 B2
(45) Date of Patent: Jul. 18, 2023

(54) APPARATUS FOR ELECTRONIC COMPONENT AND HEATING CABLE MOUNTING

(71) Applicant: nVent Services GmbH, Schaffhausen (CH)

(72) Inventors: Wesley Dong, Belmont, CA (US); Wojciech Kramarz, Wieloteka (PL); Dan Caouette, Katy, TX (US); Amir Mahani, Richmond (CA); Arkadiusz Cichocki, Wroclaw (PL)

(73) Assignee: nVent Services GmbH, Schaffhausen (CH)

( * ) Notice: Subject to any disclaimer, the term of this patent is extended or adjusted under 35 U.S.C. 154(b) by 455 days.

(21) Appl. No.: 16/791,813

(22) Filed: Feb. 14, 2020

(65) Prior Publication Data
US 2020/0267870 A1 Aug. 20, 2020

Related U.S. Application Data

(60) Provisional application No. 62/806,064, filed on Feb. 15, 2019.

(51) Int. Cl.
*H05K 7/20* (2006.01)
*H05B 3/56* (2006.01)
*H05K 7/18* (2006.01)

(52) U.S. Cl.
CPC .......... *H05K 7/20* (2013.01); *H05B 3/56* (2013.01); *H05K 7/183* (2013.01)

(58) Field of Classification Search
CPC ............ H05K 3/50; H05K 3/56; B63B 35/44
See application file for complete search history.

(56) References Cited

U.S. PATENT DOCUMENTS 5,794,795 A * 8/1998 Stemmons ............. H02B 1/202
 211/94.01
6,484,997 B1 11/2002 Edwards et al.
6,543,957 B1 4/2003 Raspotnig
(Continued)

FOREIGN PATENT DOCUMENTS

CN 2268357 Y 11/1997
DE 1968194 U 9/1967
(Continued)

OTHER PUBLICATIONS

Tranberg Enclosure Heater, technical data, R. Stahl Tranberg AS, undated, 2 pages.
(Continued)

*Primary Examiner* — Mukundbhai G Patel
(74) *Attorney, Agent, or Firm* — Quarles & Brady LLP (57) ABSTRACT

A mounting rail is provided that includes a DIN rail and one or more heating cable channels. A channel defined by the DIN rail may include one of the heating cable channels. Heating cables may be installed in the heating cable channels using adhesive and/or heat transfer material to form an electronics heating module. The heating cables may be self-regulating heating cables. The mounting rail may include multiple heat transfer fins that transfer heat generated by the heating cables to environment surrounding the mounting rail. A terminal block may be mounted on the DIN rail and may supply electric power to the heating cables.

10 Claims, 7 Drawing Sheets

(56) References Cited

U.S. PATENT DOCUMENTS

| | | | |
|---|---|---|---|
| 7,700,877 B2 | 4/2010 | Delfosse et al. | |
| 9,033,746 B1 | 5/2015 | Wu | |
| 2005/0006053 A1 | 1/2005 | Apfelbacher et al. | |
| 2006/0240683 A1 | 10/2006 | Bre'et al. | |
| 2006/0240707 A1 | 10/2006 | Bre'et al. | |
| 2019/0320502 A1* | 10/2019 | Dong | B63B 35/44 |

FOREIGN PATENT DOCUMENTS

| | | |
|---|---|---|
| DE | 29906950 U1 | 10/2000 |
| EP | 2975711 A1 | 1/2016 |
| FR | 2682230 A1 | 4/1993 |
| JP | H06223927 A | 8/1994 |
| JP | H0758459 A | 3/1995 |
| JP | 2016127624 A | 7/2016 |

OTHER PUBLICATIONS

STEGO Heaters and Fan Heaters, product list, Copyright 2020 STEGO Elektrotechnik GmbH, 9 pages.

NVent, HOFFMAN, heating enclosures product list, Copyright 2020 nVent, 2 pages.

* cited by examiner

APPARATUS FOR ELECTRONIC COMPONENT AND HEATING CABLE MOUNTING

CROSS-REFERENCE TO RELATED APPLICATIONS

This application claims priority from U.S. Provisional Patent Application No. 62/806,064 filed Feb. 15, 2019, the disclosure of which is incorporated by reference in its entirety.

BACKGROUND OF THE INVENTION

Electronics modules such as temperature controllers are corm only housed in weatherproof enclosures and used in outdoor environments. In extreme conditions, these environments may reach temperatures as low as −55° C. or even colder. Electronic components however, are usually only rated for operation in temperatures of −40° C. or warmer, and may malfunction or even suffer permanent damage if operated at excessively low temperatures. To enable operation at very low temperatures, electric heaters are sometimes used to preheat the electronics in an enclosure to a safe operating temperature. For use in hazardous locations (e.g., those in which an explosive gas atmosphere may occasionally or regularly occur in normal operation), special precautions must be taken with heaters, and consequently the cost for heating units may be high, in the order of hundreds of dollars for a small (50-100 watt) heater.

SUMMARY OF THE INVENTION

In an example embodiment, a mounting rail may have a first side and a second side, and may include a DIN rail disposed at a first side, and a heating cable channel disposed at the second side, the heating cable channel comprising a slot configured to receive a heating cable.

In some embodiments, the mounting rail may be formed from extruded aluminum.

In some embodiments, the DIN rail may define a channel that opens in a first direction. The slot of the heating cable channel may open in a second direction that is substantially perpendicular to the first direction.

In some embodiments, the mounting rail may include a structure that forms at least a bottom surface of the DIN rail and a first sidewall of the heating cable channel.

In some embodiments, the heating channel may include an additional slot configured to receive the heating cable. The additional slot may open in the second direction. The mounting rail may additionally include a first plurality of fins disposed between the slot and the additional slot and extending in a third direction that is substantially opposite the second direction and substantially perpendicular to the first direction, and a second plurality of fins disposed between the slot and the additional slot and extending in the second direction.

In some embodiments, the mounting rail may include a second heating cable channel disposed on a third side of the mounting rail that is opposite to the second side, the second heating cable channel comprising a second slot that opens in a third direction that is substantially opposite to second direction and that is substantially perpendicular to the first direction.

In some embodiments, the mounting rail may include a second heating cable channel disposed at the first side, the second heating cable channel comprising a second slot configured to receive a second heating cable.

In some embodiments, the DIN rail may define a channel that opens in a first direction. The second slot of the second heating cable channel may open in the first direction. The channel defined by the DIN rail may include the second heating cable channel. The slot of the heating cable channel may open in a second direction that is substantially opposite to the first direction.

In some embodiments, the mounting rail may include a first plurality of fins disposed at a third side of the mounting rail that extend in a third direction that is substantially perpendicular to the first and second directions, and a second plurality of fins disposed at a fourth side of the mounting rail that extend in a fourth direction that is substantially perpendicular to the first and second directions.

In an example embodiment, an electronics heating module may include a mounting rail that includes a DIN rail and a heating cable channel, and may include a heating cable disposed in the first heating cable channel.

In some embodiments, the DIN rail may include sidewalls that define portions of the heating cable channel.

In some embodiments, the heating cable channel may be a first heating cable channel that includes first slots that open in a first direction. The heating cable may be a first heating cable that is disposed in the first slots. The mounting rail may additionally include a second heating cable channel that includes second slots that open in a second direction that is substantially opposite to the first direction, a second heating cable that is disposed in the second slots of the second heating cable channel, a first plurality of fins extending outward in a third direction that is substantially perpendicular to the first and second directions, and a second plurality of fins extending outward in a fourth direction that is substantially opposite to the third direction.

In some embodiments, the heating cable channel may be a first heating cable channel that includes first slots that open in a first direction. The DIN rail may define a channel that opens in a second direction that is substantially perpendicular to the first direction. The heating cable may be a first heating cable that is disposed in the first slots. The mounting rail may additionally include a second heating cable channel that includes second slots that open in a third direction that is substantially opposite to the first direction, and a second heating cable that is disposed in the second slots of the second heating cable channel.

In some embodiments, the heating cable channel may include first and second slots that open in a first direction. The DIN rail may define a channel that opens in a second direction that is substantially perpendicular to the first direction. The heating cable may be disposed in the first and second slots. The mounting rail may additionally include a first plurality of fins extending outward in a third direction that is substantially perpendicular to the first and second directions, and a second plurality of fins extending outward in a fourth direction that is substantially opposite to the third direction. The first plurality of fins and the second plurality of fins may be interposed between the first and second slots.

In an example embodiment, a method may include steps of extruding aluminum to form a mounting rail that comprises a DIN rail and at least one heating cable channel having at least one slot, applying adhesive the at least one slot, and inserting at least one heating cable into the at least one slot of the at least one heating cable channel of the mounting rail, such that the at least one heating cable contacts the adhesive.

In some embodiments, the at least one slot may include a first slot that opens in a first direction. The DIN rail may define a channel that opens in the first direction and that overlaps the slot.

In some embodiments, the at least one heating cable channel may include a first heating cable channel and a second heating cable channel. The first heating cable channel may include the first slot. The second heating cable channel may include a second slot that opens in a second direction that is substantially opposite to the first direction.

In some embodiments, the at least one slot may include a first slot that opens in a first direction. The DIN rail may define a channel that opens in a second, direction that is perpendicular to the first direction.

In some embodiments, the at least one heating cable channel may include a first heating cable channel and a second heating cable channel. The first heating cable channel may include the first slot. The second heating cable channel may include a second slot that opens in a second direction that is substantially opposite to the first direction.

In some embodiments, the mounting rail additionally include a first plurality of fins extending in a third direction and a second plurality of fins extending in a fourth direction that is opposite to the third direction. The third direction and the fourth direction may be substantially parallel to the first direction and the second direction.

These and other aspects of the invention will become apparent from the following description. In the description, reference is made to the accompanying drawings which form a part hereof, and in which there is shown embodiments of the invention. Such embodiments do not necessarily represent the full scope of the invention and reference is made therefore, to the claims herein for interpreting the scope of the invention.

BRIEF DESCRIPTION OF THE DRAWINGS

The present invention will hereafter be described with reference to the accompanying drawings, wherein like reference numerals denote like elements.

DETAILED DESCRIPTION OF PREFERRED EMBODIMENTS

Before the present invention is described in further detail, it is to be understood that the invention is not limited to the particular aspects described. It is also to be understood that the terminology used herein is for the purpose of describing particular aspects only, and is not intended to be limiting. The scope of the present invention will be limited only by the claims. As used herein, the singular forms "a", "an", and "the" include plural aspects unless the context clearly dictates otherwise.

It should be apparent to those skilled, in the art that many additional modifications beside those already described are possible without departing from the inventive concepts. In interpreting this disclosure, all terms should be interpreted in the broadest possible manner consistent with the context. Variations of the term "comprising", "including", or "having" should be interpreted as referring to elements, components, or steps in a non-exclusive manner, so the referenced elements, components, or steps may be combined with other elements, components, or steps that are not expressly referenced. Aspects referenced as "comprising", "including", or "having" certain elements are also contemplated as "consisting essentially of" and "consisting of" those elements, unless the context clearly dictates otherwise. It should be appreciated that aspects of the invention that are described with respect to a system are applicable to the methods and vice versa, unless the context explicitly dictates otherwise.

Numeric ranges disclosed herein are inclusive of their endpoints. For example, a numeric range of between 1 and 10 includes the values 1 and 10. When a series of numeric ranges are disclosed for a given value, the present disclosure expressly contemplates ranges including all combinations of the upper and lower bounds of those ranges. For example, a numeric range of between 1 and 10 or between 2 and 9 is intended to include the numeric ranges of between 1 and 9 and between 2 and 10.

Embodiments of the present invention are generally directed toward structures (e.g., mounting rails) that include both channels for routing heating cables and a rail for the standardized mounting of equipment. The rail may be a so-called "DIN rail" dimensioned according to one or more of the, standards published by the Deutsches Institut für Normung (DIN). As used herein "DIN rail" may refer to any of the major types of DIN rail, which may include a top hat section (generally having a 35 mm width—sometimes referred to as a Type O, Type Ω, DIN35, or TS35 rail—although other DIN rail widths, such as 15 mm, 40 mm, or any other applicable DIN rail width may be used), C section, or G section DIN rail. Some embodiments of the invention may be used in certain environments, such as arctic environments or oil platform environments. These environments often encounter extreme temperatures (e.g., below −40° C.) that may cause malfunctions in electronic equipment (e.g., electronic components), which may not be rated to withstand such cold temperatures. As will be described, a custom formed mounting rail (e.g., formed from extruded metal such as aluminum) may incorporate standardized mounting features (e.g. DIN rails) for the mounting of electronic equipment (e.g., temperature controllers, wire terminals, etc.) with additional features (e.g., channels, mounting holes, and/or heat transfer fins) related to the installation and use of heating cables (e.g., self-regulating heating cables or constant wattage heating cables) or, alternatively, cartridge heaters.

For example, self-regulating heating cables that may be installed in the heating cable channels of the mounting rails described herein may have unconditional temperature ratings ("T-ratings"), such that these cables are unable to reach temperatures above their T-ratings. By installing self-regulating heating cables in the channels of an illustrative mounting rail, an electronics heating module is formed that may have the same safety rating as the self-regulating heating cables.

Figure 1A:
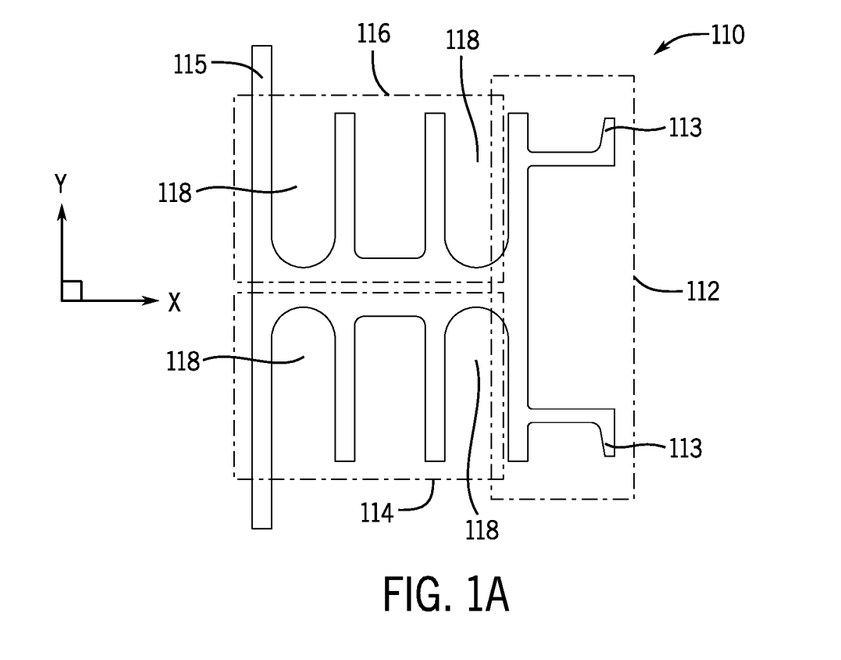
FIG. 1A shows a cross-sectional view of an illustrative mounting rail that includes a DIN rail and two sets, of heating cable channels, in accordance with an embodiment.

FIG. 1A illustrates a cross-section of an illustrative mounting rail 110, which stay be formed from extruded metal, such as aluminum. The mounting rail 110 may include, a DIN rail 112, and heating cable channels 114 and 116, all of which, may be formed from the extruded metal. For example, the DIN mil 112 may include a pair of outwardly extending flanges 113, which may be separated by an internal distance of about 25 mm. The distance from the tip of one of the flanges 113 to the tip of the other may be about 35 mm. The flanges 113 may have a thickness of about 1 mm. The mourning rail 110 may include a structure 115 that provides a substantially flat back surface adjacent to the heating cable channels 114 and 116, and located on the opposite side of the mounting ail 110 as the side on which the DIN rail 112 is disposed.

Considering the opening of the channel formed by the DIN rail 112 to be facing the front of the DIN rail 112, the heating cable channels 114 and 116 are located behind the DIN rail 112. As shown, the heating cable channels 114 and 116 include multiple slots 118, where the openings of the slots 118 of the heating cable channels 114 face a first direction (e.g., the positive Y direction) and the openings of the slots 118 of the heating cable channels 116 face a second direction (e.g., the negative Y direction) opposite the first direction. For example, the structures of the heating cable channels 114 and 116 substantially mirror one another across a central axis (e.g., the X axis) of the mounting rail 110. The first and second directions in which the slots 118 of the heating cable channels 114 and 116 face may be substantially perpendicular to a third direction (e.g., the positive X direction) toward which the opening of the channel formed by the DIN rail 112 faces. For example, a structure that forms a bottom surface of, a channel formed by the DIN rail 112 may form a sidewall of the heating cable channels 116 and a sidewall of the heating cable channels 114. Adhesive material (e.g., an epoxy resin) and/or heat transfer material (e.g., which may be silicate-based heat transfer compounds, carbon-based heat transfer compounds, and/or the like) may be applied to interior surfaces of the slots 118 prior to installing heating cables (e.g., self-regulating heating cables Or constant wattage heating cables) or cartridge heaters in those slots. For example, the adhesive material may be a temperature-resistant adhesive material, capable of withstanding temperatures as high as 125° C. and as low as −65° C. For example, the adhesive material may have a high thermal conductivity coefficient.

In some embodiments, rather than applying adhesive material and/or heat transfer material to the slots 118 to hold heating cables or cartridge heaters in place, one or more shims may be applied at the slots 118 of the mounting rail 110 (e.g., or the slots of any of the mounting rails 120, 130, 140, 160, of FIGS. 1B-1E) to hold the heating cables or cartridge heaters in place.

Figure 1B:
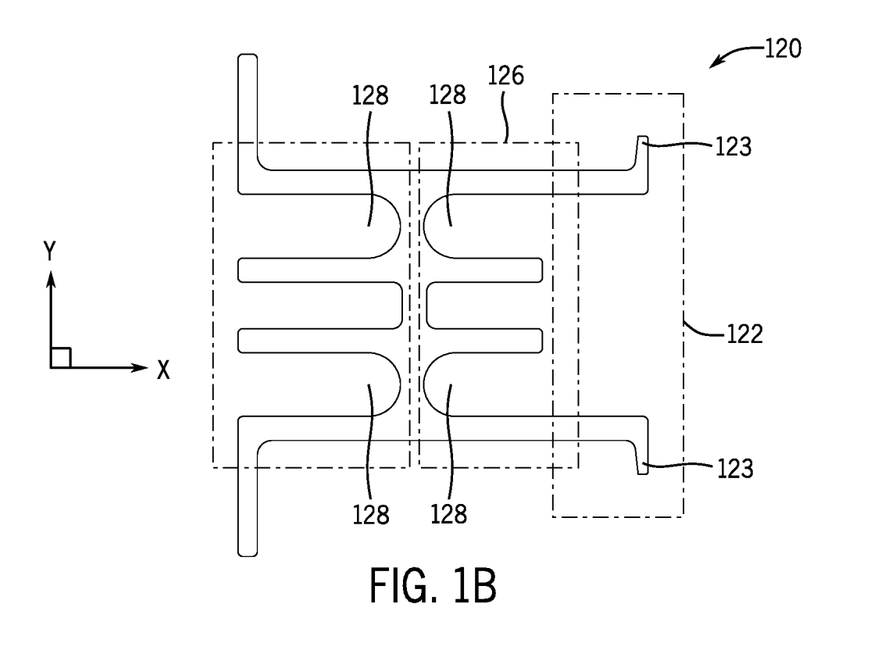
FIG. 1B shows a cross-sectional view of illustrative mounting rail that includes a DIN rail and two sets of heating cable channels, where one of the sets of heating cable channels is included in a channel formed by the DIN rail in accordance with an embodiment.

FIG. 1B illustrates a cross-section of an illustrative mounting rail 120, which may be formed from extruded metal, such as aluminum. The mounting rail 120 may include a modified DIN tail 122, and heating cable channels 124 and 126, all of which may be formed from the extruded metal. For example, the modified DIN rail 122 may include a pair of outwardly extending flanges 123, which may be separated by an internal distance of about 25 mm. The distance from the tip of one of the flanges 123 to the tip of the other may be about 35 mm. The flanges 123 may have a thickness of about 1 mm. The modified DIN rail 122 may be "modified" in that the bottom of the recessed portion of the modified DIN rad, rather than being flat, may extend deeper than the standard 7.5 mm to form the heating cable channels 126. In this way, electronic components mounted to the modified DIN rail 122 may be positioned close to or in direct contact with the heating cables inserted in the slots 128 of the heating cable channels 126.

Considering the opening of the channel formed by the modified DIN rail 122 to be facing the front of the modified DIN rail 122, the beating cable channels 124 and 126 are located behind the modified DIN rail 122, with the openings of the slots 128 of the heating cable channels 126 overlapping the opening of die channel formed by the modified DIN rail 122. As shown, the heating cable channels 124 and 126 include multiple slots 128, where the openings of the slots 128 of the heating cable channels 124 face a first direction (e.g., the negative X direction) and the openings of the, slots 128 of the heating cable channels 126 face a second direction (e.g., the positive X direction) opposite the first direction. For example, the inner structures of the heating cable channels 124 and 126 may substantially mirror one another across a central axis (e.g., the Y axis) of the mounting rail 120. For example, structures that form sidewalk of the modified DIN rail 122 may extend to form sidewalls of the heating cable channels 126. Adhesive material and/or heat transfer material (e.g., which may be silicate-based heat transfer compounds, carbon-based heat transfer compounds, and/or the like) may be applied to interior surfaces of the slots 128 prior to installing, heating cables e.g., self-regulating heating cables) in those slots. For example, the adhesive material may be a temperature-resistant adhesive material, capable of withstanding temperatures as high as 125° C. and as low as −65° C. For example, the adhesive material may have a high thermal conductivity coefficient.

Figure 1C:
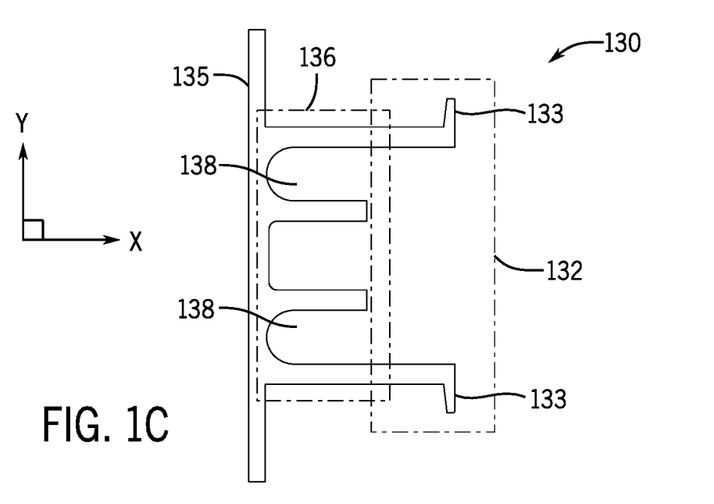
FIG. 1C shows a cross-sectional view of an illustrative mounting rail that includes a DIN rail and one set of heating cable channels, in accordance with an embodiment.

FIG. 1C illustrates a cross-section of an illustrative mounting rail 130, which may be formed from extruded metal, such as aluminum. The mounting rail 130 may include a modified DIN rail 132, and heating cable channels 136, all of which may be formed from the extruded metal. For example, the modified DIN rail 132 may include a pair of outwardly extending flanges 133, which may be separated by an internal distance of about 25 mm. The distance from the tip of one of the flanges 133 to the tip of the other may be about 35 mm. The flanges 133 may have a thickness of about 1 mm. The modified DIN rail 132 may be "modified" in that the bottom of the recessed portion of the modified DIN rail 132, rather than being flat, may extend deeper than the standard 7.5 mm to form the heating cable channels 136. In this way, electronic components mourned to the modified DIN rail 132 may be positioned close to or in direct contact with the heating cables inserted in the slots 138 of the heating cable channels 136.

As shown, the heating cable channels 136 include multiple slots 138 having openings that overlap with the opening of the channel formed by the modified DIN rail 132. For example, structures that firm sidewalls of the modified DIN rail 132 may extend to form sidewalls of the heating cable channels 136. Rather than having a separate set of heating cable channels opposite the heating cable channels 136 (e.g., the arrangement of the mounting rail 120 of FIG. 1B), the mounting rail 130 includes a structure 135 that provides a substantially flat back surface behind the heating cable channels 136. Adhesive material and/or a heat transfer material (e.g., which may include a silicate-based heat transfer compound, carbon-based heat transfer compound, and/or the like) may be applied to interior surfaces of the slots 138 prior to installing heating cables (e.g., self-regulating heating cables) in those, slots. For example, the adhesive material may be a temperature-resistant adhesive material, capable of withstanding temperatures as high as 125° C. and as low as −65° C. For example, the adhesive material may have a high thermal conductivity coefficient.

Figure 1D:
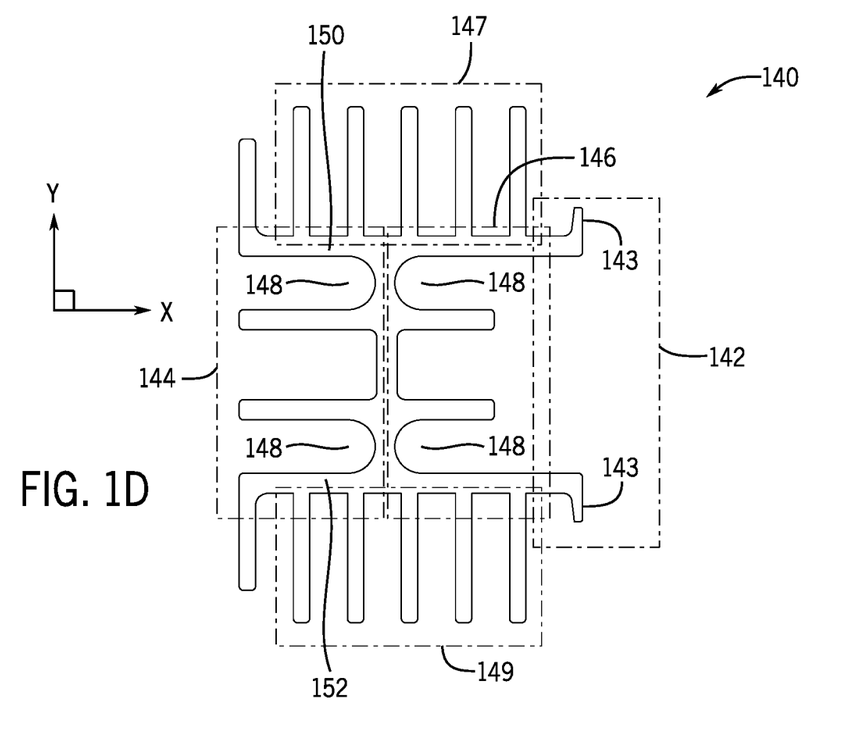
FIG. 1D shows a cross-sectional view of an illustrative mounting rail that includes a DIN rail, two sets of heating cable channels, and two sets of heat transfer fins, where one of the sets of heating cable channels is included in a channel formed by the DIN rail, in accordance with an embodiment.

FIG. 1D illustrates a cross-section of an illustrative mounting rail 140, which may be formed from extruded metal, such as aluminum. The mounting rail 140 may include a modified DIN rail 142, heating cable channels 144 and 146, and fins 147 and 149 (sometimes referred to herein as "heat dissipation fins" or "heat transfer fins"), all of which may be formed from the extruded metal. For example, the modified DIN rail 142 may include a pair of outwardly extending flanges 143, which may be separated by an internal distance of about 25 mm. The distance from the tip of one of the flanges 143 to the tip of the other may be about 35 mm. The flanges 143 may have a thickness of about 1 mm. The modified DIN rail 142 may be "modified" in that the bottom of the recessed portion of the modified DIN rail, rather than being flat, may extend deeper than the standard 7.5 mm to form the, heating cable channels 146. In this way, electronic components mounted to the modified DIN rail 142 may be positioned close to of in direct contact with the heating cables inserted in the slots 148 of the heating cable channels 146.

Considering the opening of the channel formed by the modified DIN rail 142 to be facing the front of the modified DIN rail 142, the heating cable channels 144 and 146 are located behind the modified DIN rail 142, with the openings of the slots 148 of the heating cable channels 146 overlapping the opening of the channel formed by the modified DIN rail 142. As shown, the heating cable channels 144 and 146 include multiple slots 148, where the openings of the slots 148 of the heating cable channels 144 face a first direction (e.g., the negative X direction) and the openings of the slots 148 of the heating cable channels 146 face a second direction (e.g., the positive X direction) opposite the first direction. For example, the inner-structures of the heating cable channels 144 and 146 may substantially mirror one another across a central axis e.g., the Y axis) of the mounting rail 140. For example, structures that form sidewalls of the modified DIN rail 142 may extend to form sidewalls of the heating cable channels 146. Adhesive material and/or a heat transfer material e.g., which may include a silicate-based heat transfer compound, carbon-based heat transfer compound, and/or the like) may be applied to interior surfaces of the slots 148 prior to installing heating cables (e.g., self-regulating heating cables) in those slots. For example, the adhesive material may be a temperature-resistant adhesive material, capable of withstanding temperatures as high as 125° C. and as low as −65° C. For example, the adhesive material may have a high thermal conductivity coefficient.

The fins 147 may extend outwardly (e.g., in the Y direction) from an outer surface of a structure 150 that forms a wall of the heating cable channels 144, a wall of the heating cable channels 146, and a portion of the modified DIN rail 143. The fins 149 may extend outwardly (e.g., in the negative Y direction) from an outer surface of a structure 152 that forms a wall of the heating cable channels 144, a wall of the heating cable channels 146, and a portion of the modified DIN rail 143. The structure 150 and the structure 152 may be located at opposite sides of the heating cable channels 144 and opposite sides of the heating cable channels 146. The fins 147 and 149 may aid in the transfer of heat generated by heating cables installed in the slots 148 to the area (e.g., air) surrounding the mounting rail 140.

Figure 1E:
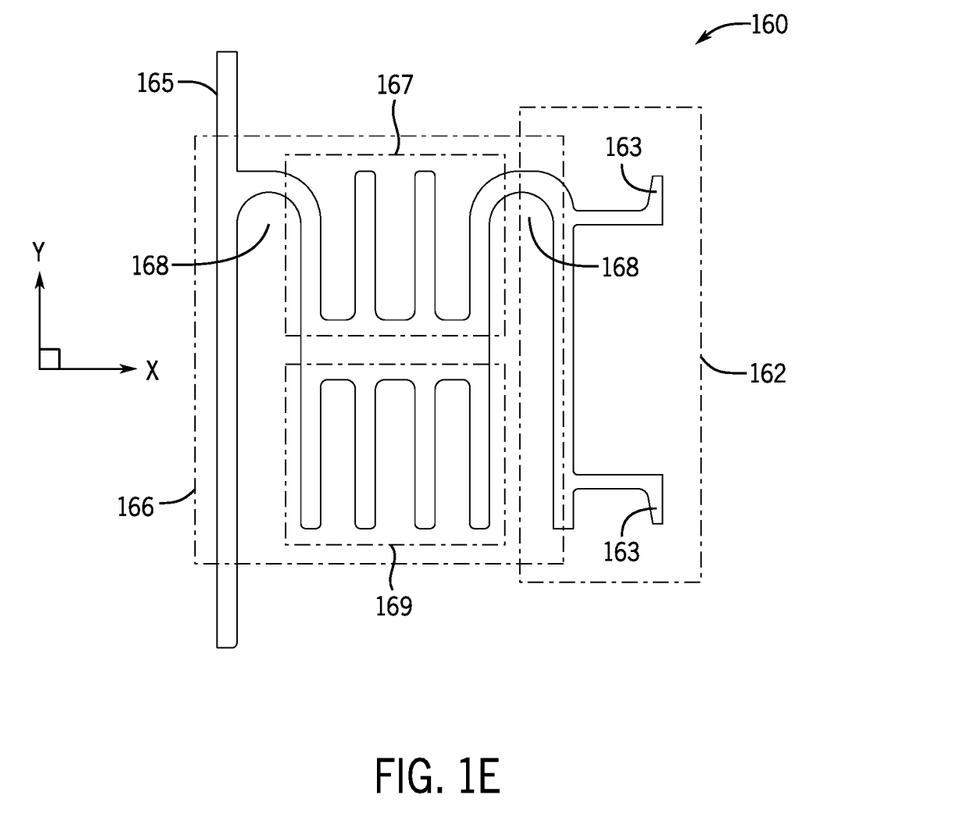
FIG. 1E shows a cross-sectional view of an illustrative mounting rail that includes a DIN rail, one set of heating cable channels deep enough to hold two stacked heating cables, and two sets of heat transfer fins disposed between the set of heating cable channels, in accordance with an embodiment.

FIG. 1E illustrates a cross-section of an illustrative mounting rail 160, which may be formed from extruded metal, such as aluminum. The mounting rail 160 may include a DIN rail 162, a set of heating cable channels 166, and heat dissipation fins 167 and 169, all of which may be formed from the extruded metal. For example, the DIN rail 162 may include a pair of outwardly extending flanges 163, which may be separated by an internal distance of about 25 mm. The distance from the outer tip of one of the flanges 163 to that of the tip of the other may be about 35 mm. The flanges 163 may have a thickness of about 1 mm. These dimensions are intended to be illustrative and not limiting, and different dimensions may be used for different variants of DIN rail.

The mounting rail 160 may include a structure 165 that provides a substantially flat back surface adjacent to the heating cable channels 166 and located on the opposite side of the mounting rad 160 as the side on which the DIN rail 162 is disposed.

Considering the opening of the channel formed by the DIN rail 162 to be facing the front of the DIN rail 162, the heating cable channels 166 are located behind the DIN rail 162. As shown, the set of heating cable channels 166 includes slots 168, where the openings of the slots 168 of the set of heating cable channels 166 face a first direction (e.g., the negative Y direction) and the opening of the channel formed by the DIN rail 162 faces a second direction (e.g., the positive X direction) that is substantially perpendicular to the first direction. For example, a structure that forms a bottom surface (i.e., not the sidewall structures of the DIN rail 162 from which the flanges 163 extend) of the channel formed by the DIN rail 162 may form at least a portion of a sidewall of the heating cable channels 166. Fins 167 and 169 are disposed between the interior sidewalls of the set of heating cable channels 166, where some of the fins 169 form a portion of these interior sidewalls. The fins 167 and 169 may extend outward from a central body, with the fins 169 extending in the first direction (e.g., the same direction in which the openings of the slots 168 of the set of heating channels 166 extend; the negative Y direction), and the fins 167 extending in a third direction that is substantially opposite the first direction (e.g., the positive Y direction). While each of the sets of heat dissipation fins 167 and 169 are shown to include at least two inner metal extrusions interposed between two outer walls (in the case of fins 167) or two outer metal extrusions, it should be understood that this is intended to be illustrative and not limiting. In other embodiments, any applicable number of metal extrusions may be included in the fins 167 and/or fins 169.

Adhesive material (e.g., an epoxy resin) and/or a heat transfer material (e.g., which may include a silicate-based heat transfer compound, carbon-based heat transfer compound, and/or the like) may be applied to interior surfaces of the slots 168 prior to installing heating cables (e.g., self-regulating heating cables or constant wattage, heating cables) or cartridge heaters in those slots. For example, the adhesive material may be a temperature-resistant adhesive material, capable of withstanding temperatures as high as 125° C. and as low as −65° C. For example, the adhesive material may have a high thermal conductivity coefficient.

Figure 2:
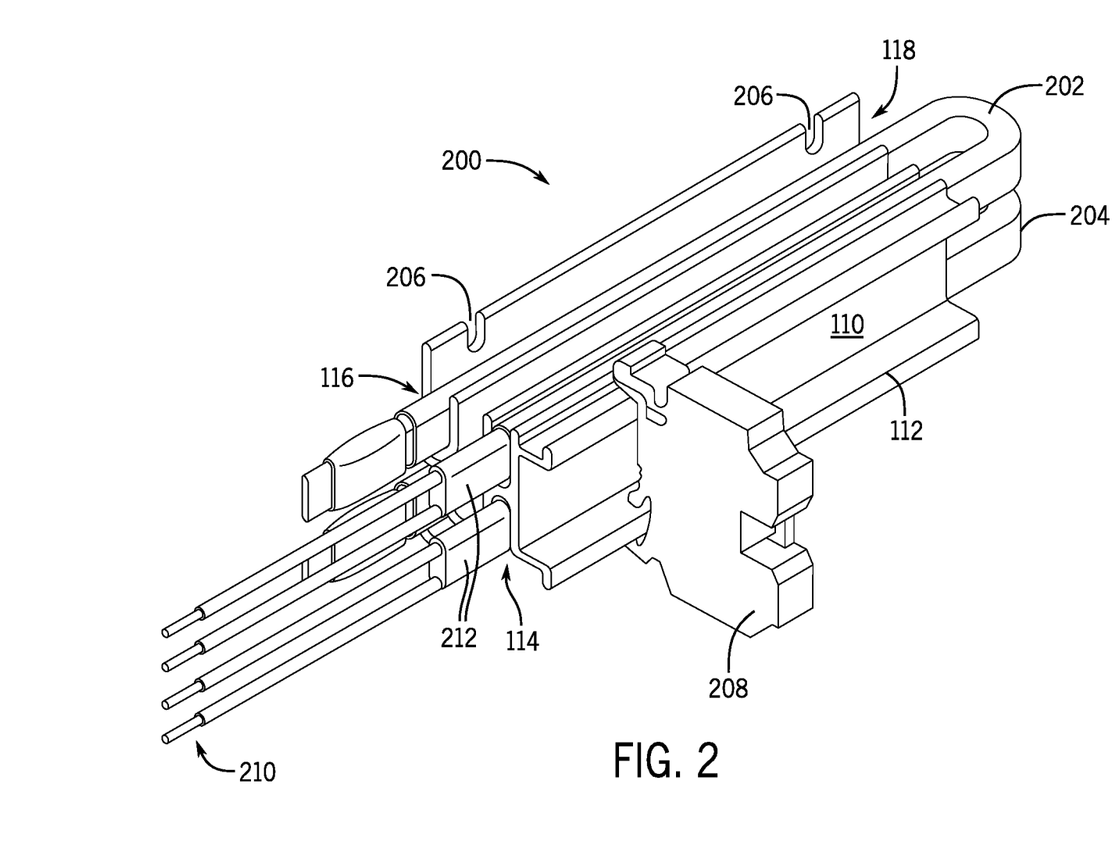
FIG. 2 shows a perspective view of an illustrative electronics heating module that includes a mounting rail of the type shown in FIG. 1A, in accordance with an embodiment.

FIG. 2 shows a perspective view of an illustrative electronics heating module 200 that includes the mounting rail 110 of FIG. 1A on which heating cables 202 and 204 and a terminal block 208 have been installed. As shown, heating cables 202 and 204 may be installed in the slots 118 of the heating cable channels 114 and 116 of, the mounting rail 110 (e.g., by placing the heating cables 202 and 204 in the slots 116 in contact with an adhesive and or heat transfer material lining at least a portion of the slots 118, then actively or passively setting the adhesive and/or heat transfer material (depending on the type of adhesive and/or heat transfer material used). The heating cables 202 and 204 may be self-regulating heating cables that include conductive cores 212 that link (e.g., electrically and physically link) bus wires 210. The conductive cores, may include positive temperature coefficient (PTC) material, for example.

As an example, the conductive core 212 of the heating cable 202 may encapsulate and space apart the bus wires 210 of the heating cable 202. During operation, electric current flowing between the bus wires 210 through the conductive core 212 may be converted by the conductive core 212 into thermal energy via resistive heating. As the PCT material of the conductive core 212 is heated, its electrical resistance is decreased, causing less electric current to be passed between the bus wires 210, causing less thermal energy to be output by the conductive core 212. In this way, the heating: cable 202 may be "self-regulating," so that as the heating cable 202 gets progressively hotter, it produces progressively less heat. For example, the bus wires 210 may be supplied with electrical power via a terminal block mounted on the DIN rail 112 that is coupled to an external power supply, or may be supplied with electrical power via a direct connection to such an external power supply.

As shown, mounting holes 206 (sometimes referred to as mounting features) may be drilled or otherwise machined into the mounting rail 110 (e.g., after the extrusion of the metal from which the mounting rail 110 is formed) so that, the mounting rail 110 may be affixed to a surface (e.g., a wall or panel) with screws, nails, or other applicable fasteners. For example, the mounting holes 206 may be drilled or machined into a rear structure (e.g., wall) of the mounting rail 110.

As shown, the terminal block 208 may be dimensioned to be mounted to a DIN rail, such as the DIN rail 112. It should be understood that other DIN-rail-mountable components (e.g., electronic components) may also be installed on the DIN rail 112. For example, a terminal block may be mounted to the DIN rail 112 through which electric power may be provided to the bus wires 210 of the heating cables 202 and 204. As another example, a control unit ay be mounted to the DIN rail 112 that controls electric power being provided to the heating cables 202 and 204.

Figure 3:
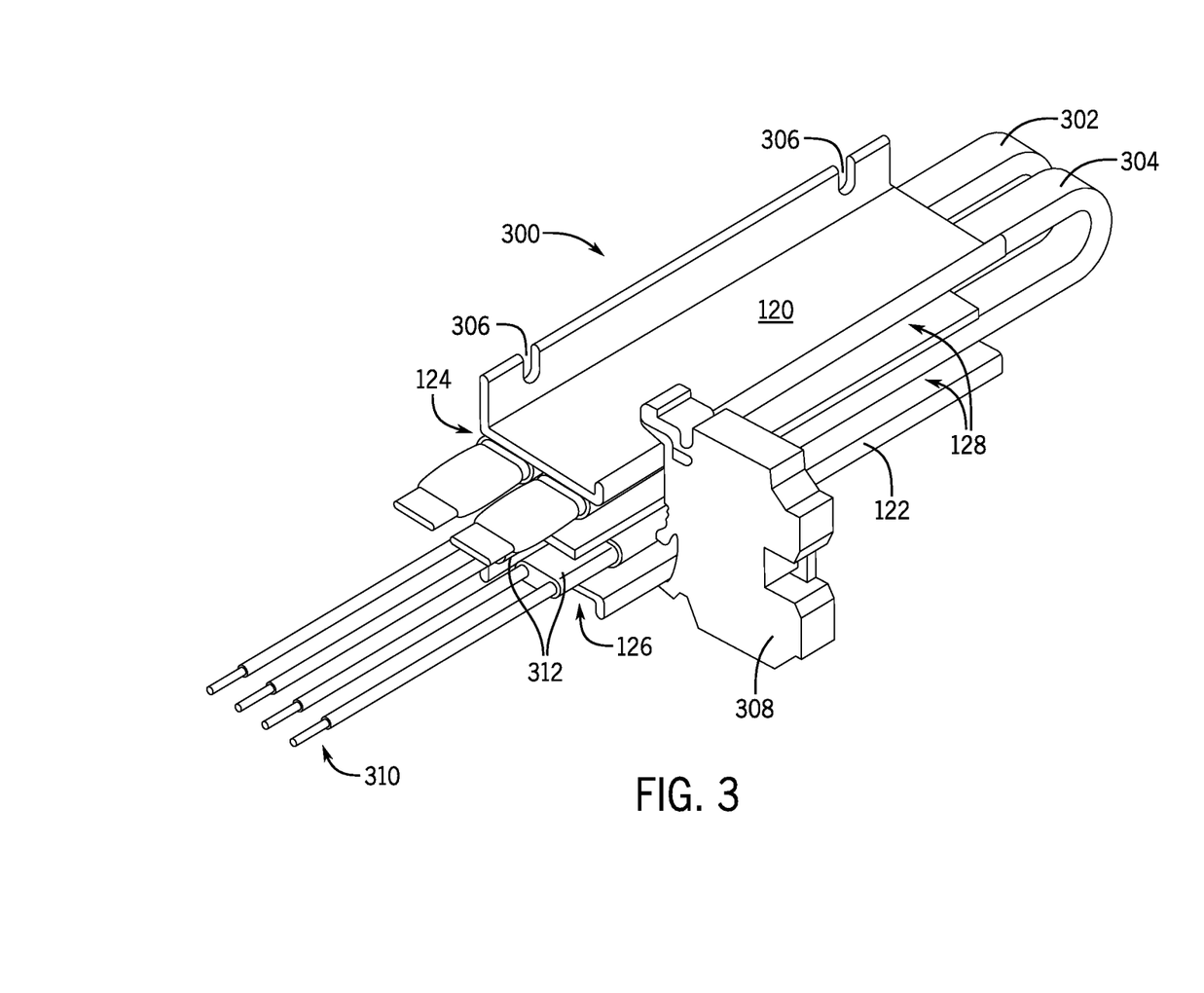
FIG. 3 shows a perspective view of an illustrative electronics heating module that includes a mounting rail of the type shown in FIG. 1B, in accordance with an embodiment.

FIG. 3 shows a perspective view of an illustrative electronics heating module 300 that includes the mounting rail 120 of FIG. 1B on which heating cables 302 and 304 and a terminal block 308 have been installed. As shown, heating cables 302 and 304 may be installed in the slots 128 of the heating cable channels 124 and 126 of the mounting rail 120 (e.g., by placing the heating cables 302 and 304 in the slots 128 in contact with an adhesive and/or heat transfer material lining at least a portion of the slots 128, then actively or passively setting the adhesive and/or heat transfer material (depending on the type of adhesive and/or heat transfer material used). The heating cables 302 and 304 may be self-regulating heating cables that include conductive cores 312 that link (e.g., electrically and physically link) bus wires 310. The conductive cores may include positive temperature coefficient (PTC) material, for example.

As an example, the conductive core 312 of the heating cable 302 may encapsulate and space apart the bus wires 310 of the heating cable 302, During operation, electric current flowing between the bus, wires 310 through the conductive core 312 may be converted by the conductive core 312 into thermal energy via resistive heating. As the PCT material of the conductive core 312 is heated, its electrical resistance is decreased, causing less electric current to be passed between the bus wires 310, causing less thermal energy to be output by the conductive core 312. In this way, the heating cable 302 may be "self-regulating," so that as the heating cable 302 gets progressively hotter, it produces progressively less heat. For example, the bus wires 310 may be supplied with electrical power via a terminal block mounted on the modified DIN rail 122.

As shown, mounting holes 306 (sometimes referred to as mounting features) may be drilled or other machined into the mounting rail 120 (e.g., after the extrusion of the metal from which the mounting rail 120 is formed) so that the mounting rail 120 may be affixed to a surface (e.g., a wall or panel) with screws, nails, or other applicable fasteners. For example, the mounting holes 306 may be drilled or machined into a rear structure (e.g., wall) of the mounting rail 120.

As shown, the terminal block 308 may be dimensioned to be mounted to a DIN rail, such as the modified DIN rail 122. It should be understood that other DIN-rail tunable components (e.g., electronic components) may also be installed on the modified DIN rail 122. For example, a terminal block may be mounted to the modified DIN rail 122 through which electric power may be provided to the bus wires 310 of the heating cables 302 and 304. As another example, a control unit may be mounted to the modified DIN rail 122 that controls electric power being provided to the heating cables 302 and 304.

Figure 4:
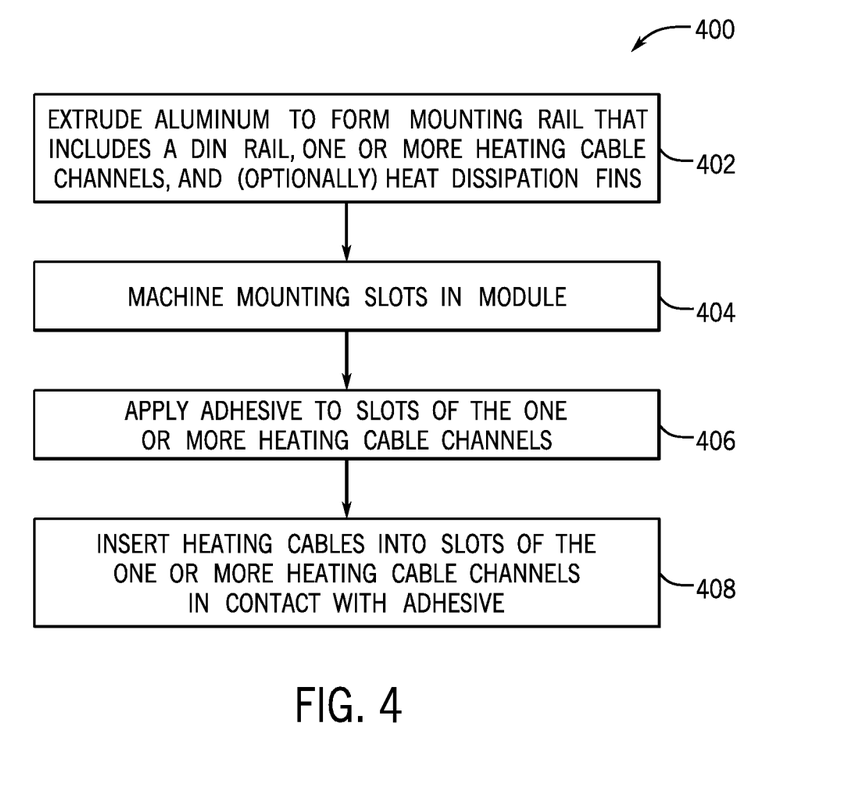
FIG. 4 shows an illustrative process flow of a method of fabricating an electronics heating module that includes a mounting rail having a DIN rail and a heating cable channel into which adhesive and/or heat transfer material is applied and a heating cable is inserted, in accordance with an embodiment.

FIG. 4 shows an illustrative process flow for a method 400 by which mounting modules (e.g., mounting modules 110, 120, 130, 140, 160 of FIGS. 1A-1E) formed.

Figure 5:
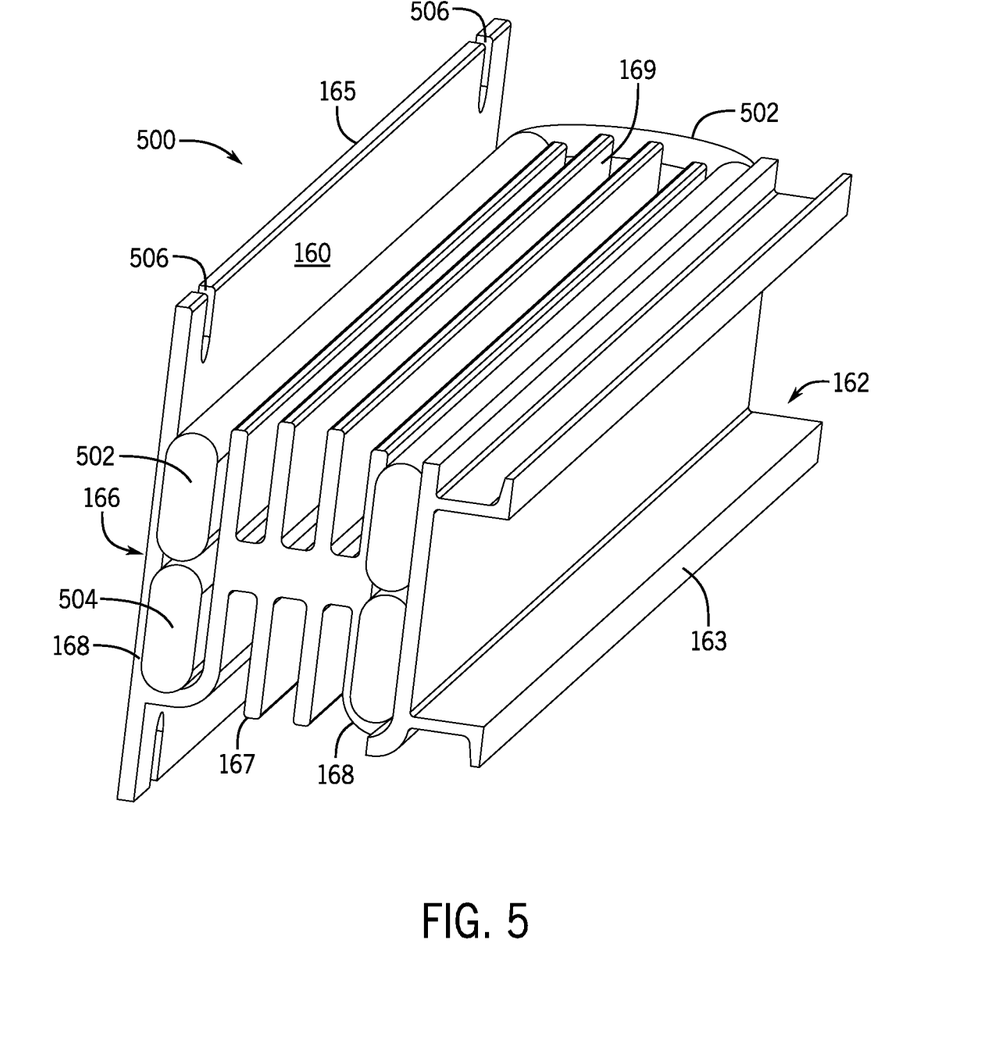
FIG. 5 shows a cross-sectional perspective view of an illustrative electronics heating module that includes a mourning rail of the type shown in FIG. 1E, in accordance with an embodiment.

At step 402, aluminum is extruded to thrill a mounting rail that includes a DIN rail (e.g., DIN rail 112, 122, 132, 142, 162, FIGS. 1A-1E), one or more heating cable channels (e.g., heating cable channels 114, 116, 124, 126, 136, 144 146, 166 FIGS. 1A-1E), and, optionally, one or more heat dissipation fins (e.g., fins 147, 149, 167, 169, FIGS. 1A-1E). The heating cable channels may be dimensioned to hold one or more heating cables (e.g., heating cables 202, 204, 302, 304, 502, 504. FIGS. 2, 3, 5), such as self-regulating heating cables. While the present example describes heating cables and refers to the channels as "heating cable channels", it should be understood that in alternate embodiments, cartridge heaters may be used instead of heating cables, and may be inserted into these channels as part of the method 400. The heat dissipation fins may transfer heat to an area proximal to the mounting rail during operation of the heating cables.

At step 404, mounting features (e.g., mounting holes 206, 306, 506 FIGS. 2, 3, 5) may be machined into the mounting rail. The mounting features may allow the mounting rail to be affixed to one or more surfaces via screws, nails, or other applicable fasteners.

At step 406, adhesive material and/or a heat transfer material is applied to interior surfaces (e.g., side all surfaces and bottom/floor surfaces) of the slots (e.g., slots 118, 128, 138, 148, 168, FIGS. 1A-1E) of the heating cable channels. For example, if an adhesive material is used, the adhesive material may be a liquid adhesive such as a two part epoxy or silicone-based adhesive material. For example, if a heat transfer material is used, the heat transfer material may include carbon e.g., graphite), silicate or other silicon-based material, and/or other applicable thermally conductive materials.

At step 408, heating cables are inserted into the slots of the heating cable channels in contact with the adhesive material and/or heat transfer material, such that the heating cables become fixed in place in the slots once the adhesive material and/or heat transfer material sets. In some embodiments, the adhesive material and/or heat transfer material may be set via curing, which may be induced via additives e.g., hardeners such as polyamine) introduced to the adhesive material and/or heat transfer material at step 406), or may be induced through the application of heat to the adhesive material and/or heat transfer material.

In some embodiments (e.g., for the mounting rails 110, 120, 140 of FIGS. 1A, 1B, 1D), the application of adhesive and/or heat transfer material and insertion of heating cables of steps 406 and 408 may be each performed in twice sequentially, once for each set of slots included in the mounting rails. For example, first adhesive and/or heat transfer material may be applied to the slots of a first set of heating cable channels (e.g., 114, 124, 144, FIGS. 1A, 1B, 1D), a first heating cable can be inserted in the first set of heating cable channels, then the first adhesive and/or heat transfer material may be set. During this process, the mounting rail may be aligned so that the openings of the first set of beating cable channels may be substantially facing upwards (e.g., opposing gravity), such that the first adhesive and/or heat transfer material and the first heating cable may be retained in the openings of the first set of heating cable channels while the first adhesive and/or heat transfer material sets. Once the first adhesive and/or heat transfer material sets, the mounting rail may be rotated by around 180 degrees, until the openings of the second set of heating cable channels (e.g., channels 116, 126, 146, FIGS. 1A, 1B, 1D) face upwards (e.g., opposing gravity). Second adhesive and/or heat transfer material may then be applied to the slots of the second set of heating cable channels, then a second heating cable can be inserted in the slots of the second set of heating cable channels, and the second adhesive and/or heat transfer material may be set.

Alternatively, when only a single set of heating cable channels is included in the mounting rail (e.g., as is the case with mounting rails 130, 150, FIGS. 1C, 1E), such additional steps of rotation and secondary adhesive and/or heat transfer material setting may not be required, and steps 406 and 408 may only need to be performed once.

FIG. 5 shows a perspective view of an illustrative electronics heating module 500 that includes the mounting rail 160 of FIG. 1E on which heating cables 502 and 504. As shown, heating cables 502 and 504 may be installed in the slots 168 of the heating cable channels 166 of the mounting rail 160 (e.g., by placing the heating cables 502 and 504 in the slots 168 in contact with an adhesive and/or heat transfer material lining at least a portion of the slots 168, then actively or passively setting the adhesive and/or heat transfer material depending on the type of adhesive and/or heat transfer material used). The heating cables 502 and 504 may be self-regulating heating cables that include conductive cores (not shown) that link (e.g., electrically and physically link) bus wires (not shown) disposed in the heating cables 502 and 504. The conductive cores may include positive temperature coefficient (PTC) material, for example.

As an example, the conductive core of the heating cable 502 may encapsulate and space apart the bus wires of the heating cable 502. During operation, electric current flowing between the bus wires through the conductive core may be converted by the conductive core into thermal energy via resistive heating. As the PCT material of the conductive core is heated, its electrical resistance is decreased, causing less electric current to be passed between the bus wires, causing less thermal energy to be output by the conductive, core. In this way, the heating cable 502 may be "self-regulating," so that as the heating cable 502 gets progressively hotter, it produces progressively less heat. For example, the bus wires may be supplied with electrical power via a terminal block mounted on the DIN rail 162 that is coupled to an external power supply or may be supplied with electrical power via a direct connection to such an external power supply. While the bus wires and conductive cores of the heating cables 502 and 504 are not shown in the simplified view of these cables in FIG. 5, it should be understood that the heating cables 502 and 504 may include an arrangement of bus wires and conductive cores similar to that of the bus wires 210, 310 and conductive cores 212, 312 of FIGS. 2 and 3.

As shown, mounting holes 506 (sometimes referred to as mounting features) may be drilled or otherwise machined into the mounting rail 160 (e.g., after the extrusion of the metal from which the mounting rail 160 is formed) so that the mounting rail 160 may be affixed to a surface (e.g., a wall or panel) with screws, nails, or other applicable fasteners. For example, the mounting holes 506 may be drilled or machined into the rear structure 165 (e.g., wall) of the mounting rail 160.

In addition to terminal blocks, other DIN-rail-mountable components (e.g., electronic components) may also be installed on the DIN rail 162. For example, a terminal block may be mounted the DIN rail 162 through which electric power may be provided to the bus wires of the heating cables 502 and 504. As another example, a control unit may be mounted to the DIN rail 162 that controls electric power being provided to the heating cables 502 and 504.

While the invention has been illustrated and described in detail in the foregoing drawings and description, the same is to be considered as illustrative and not restrictive in character, it being understood that only illustrative embodiments thereof have been shown and described and that all changes and modifications that come within the spirit of the invention are desired to be protected. For example, any of the features or functions of any of the embodiments disclosed herein may be incorporated into any of the other embodiments disclosed herein.

What is claimed is:

1. A mounting rail having a first side and a second side, the mounting rail comprising:
   a DIN rail disposed at a first side, wherein the DIN rail defines a channel that opens in a first direction;

a heating cable channel disposed at the second side, the heating cable channel comprising a slot configured to receive a heating cable and an additional slot configured to receive the heating cable, the slot and the additional slot facing the same direction, wherein the slot opens in a second direction that is substantially perpendicular to the first direction;

a first plurality of fins disposed between the slot and the additional slot and extending in a third direction that is substantially opposite the second direction and substantially perpendicular to the first direction; and a second plurality of fins disposed between the slot and the additional slot and extending in the second direction.

2. The mounting rail of claim 1, wherein the mounting rail is formed from extruded aluminum.

3. The mounting rail of claim 1, further comprising:
a structure that forms at least a bottom surface of the DIN rail and a first sidewall of the heating cable channel.

4. An electronics heating module comprising:
a mounting rail comprising:
   a DIN rail;
   a first heating cable channel including first slots that open in a first direction; and
   a second heating cable channel that includes second slots that open in a third direction that is substantially opposite to the first direction, wherein the DIN rail defines a channel that opens in a second direction that is substantially perpendicular to the first direction;
a first heating cable disposed in the first slots; and
a second heating cable that is disposed in the second slots of the second heating cable channel.

5. The electronics heating module of claim 4, wherein the mounting rail further comprises
a first plurality of fins.

6. A method comprising:
extruding aluminum to form a mounting rail that comprises a DIN rail and a heating cable channel having a slot:
applying adhesive the slot;
inserting a first heating cable into the slot of the heating cable channel of the mounting rail, such that the first heating cable contacts the adhesive; and
stacking a second heating cable over the first heating cable in the slot of the heating cable channel of the mounting rail, such that the second heating cable contacts the adhesive,
wherein the slot includes a first slot and a second slot, and the mounting rail further comprises a first plurality of fins interposed between the first slot and the second slot.

7. The method of claim 6, wherein the first slot opens in a first direction, wherein the DIN rail defines a channel that opens in the first direction and that overlaps the first slot.

8. The method of claim 7, wherein the heating cable channel comprises a first heating cable channel and a second heating cable channel, wherein the first heating cable channel includes the first slot, wherein the second heating cable channel includes the second slot that opens in a second direction that is substantially opposite to the first direction.

9. The method of claim 6, wherein the first slot opens in a first direction, wherein the DIN rail defines a channel that opens in a second direction that is perpendicular to the first direction.

10. The method of claim 9, wherein the heating cable channel comprises a first heating cable channel and a second heating cable channel, wherein the first heating cable channel includes the first slot, wherein the second heating cable channel includes the second slot that opens in a third direction that is substantially opposite to the first direction.

* * * * *

UNITED STATES PATENT AND TRADEMARK OFFICE
CERTIFICATE OF CORRECTION

PATENT NO. : 11,706,897 B2
APPLICATION NO. : 16/791813
DATED : July 18, 2023
INVENTOR(S) : Wesley Dong et al.

It is certified that error appears in the above-identified patent and that said Letters Patent is hereby corrected as shown below:

In the Specification

Column 1, Line 16, "corm only" should be --commonly--.

Column 3, Line 46, "of illustrative" should be --of an illustrative--.

Column 4, Line 12, "mourning" should be --mounting--.

Column 5, Line 25, "stay" should be --may--.

Column 5, Line 29, "mil" should be --rail--.

Column 5, Line 34, "mourning" should be --mounting--.

Column 5, Line 37, "ail" should be --rail--.

Column 6, Line 13, "tail" should be --rail--.

Column 6, Line 22, "rad" should be --rail--.

Column 6, Line 30, "beating" should be --heating--.

Column 6, Line 33, "die" should be --the--.

Column 6, Line 43, "sidewalk" should be --sidewalls--.

Column 6, Line 49, "cables e.g.," should be --cables (e.g.,--.

Column 7, Line 2, "mourned" should be --mounted--.

Signed and Sealed this
Thirty-first Day of October, 2023

*Katherine Kelly Vidal*
Katherine Kelly Vidal
*Director of the United States Patent and Trademark Office*

CERTIFICATE OF CORRECTION (continued)
U.S. Pat. No. 11,706,897 B2

Column 7, Line 9, "firms" should be --form--.

Column 7, Line 43, "of" should be --or--.

Column 7, Line 64, "material e.g.," should be --material (e.g.,--.

Column 8, Line 38, "rad" should be --rail--.

Column 9, Line 21, "116" should be --118--.

Column 9, Line 63, "ay" should be --may--.

Column 10, Line 32, "other" should be --otherwise--.

Column 10, Line 42, "tunable" should be --mountable--.

Column 10, Line 54, "thrill" should be --form--.

Column 10, Line 59, "1A-1E" should be --1D, 1E--.

Column 11, Line 10, "side all" should be --sidewall--.

Column 11, Line 25-26, "additives e.g.," should be --additives (e.g.,--.

Column 11, Line 42, "beating" should be --heating--.

Column 12, Line 47, "mounted the" should be --mounted to the--.